United States Patent
Kawasaki et al.

(10) Patent No.: US 9,148,123 B2
(45) Date of Patent: Sep. 29, 2015

(54) LADDER FILTER DEVICE AND ELASTIC WAVE RESONATOR

(71) Applicant: Murata Manufacturing Co., Ltd., Nagaokakyo-shi, Kyoto-fu (JP)

(72) Inventors: Koichiro Kawasaki, Nagaokakyo (JP); Tetsuro Okuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 169 days.

(21) Appl. No.: 13/959,962

(22) Filed: Aug. 6, 2013

(65) Prior Publication Data

US 2013/0314178 A1  Nov. 28, 2013

Related U.S. Application Data

(63) Continuation of application No. PCT/JP2012/051447, filed on Jan. 24, 2012.

(30) Foreign Application Priority Data

Feb. 8, 2011 (JP) ................. 2011-025105

(51) Int. Cl.
  *H03H 9/64* (2006.01)
  *H03H 9/02* (2006.01)
  *H03H 9/145* (2006.01)
  *H03H 7/075* (2006.01)

(52) U.S. Cl.
  CPC ........... *H03H 9/6483* (2013.01); *H03H 9/0222* (2013.01); *H03H 9/1452* (2013.01); *H03H 9/14573* (2013.01); *H03H 9/6496* (2013.01); *H03H 7/075* (2013.01)

(58) Field of Classification Search
  CPC ............ H03H 9/02881; H03H 9/1452; H03H 9/6483; H03H 9/0222; H03H 9/14573; H03H 9/6496; H03H 7/075
  USPC ................................ 333/194, 196; 310/313 C
  See application file for complete search history.

(56) References Cited

U.S. PATENT DOCUMENTS

| | | | |
|---|---|---|---|
| 6,445,261 B1 * | 9/2002 | Yuda et al. | 333/133 |
| 6,522,219 B2 | 2/2003 | Takamiya et al. | |
| 6,891,449 B2 * | 5/2005 | Takayama et al. | 333/133 |
| 2001/0008387 A1 * | 7/2001 | Taniguchi | 333/193 |

(Continued)

FOREIGN PATENT DOCUMENTS

| | | |
|---|---|---|
| JP | 09-246911 A | 9/1997 |
| JP | 2002-084162 A | 3/2002 |
| JP | 2009-219045 A | 9/2009 |
| WO | 2007/108269 A1 | 9/2007 |
| WO | 2010/137279 A1 | 12/2010 |
| WO | 2010/137648 A1 | 12/2010 |
| WO | 2010/140456 A1 | 12/2010 |

OTHER PUBLICATIONS

Official Communication issued in International Patent Application No. PCT/JP2012/051447, mailed on Mar. 19, 2012.
Official Communication issued in corresponding German Patent Application No. 11 2012 000 719.0, mailed on Apr. 28, 2014.

*Primary Examiner* — Barbara Summons
(74) *Attorney, Agent, or Firm* — Keating & Bennett, LLP

(57) ABSTRACT

A ladder filter device includes elastic wave resonators with IDT electrodes. An apodization angle θ in an IDT electrode of a series arm resonator in the ladder filter device falls within a range from about 2° to about 14° with respect to an elastic wave propagation direction. This arrangement provides a ladder filter device that has a smaller insertion loss in a low frequency side portion of a passing band.

10 Claims, 4 Drawing Sheets

(56) References Cited

U.S. PATENT DOCUMENTS

| | | |
|---|---|---|
| 2001/0011932 A1 | 8/2001 | Takamiya et al. |
| 2002/0044497 A1 | 4/2002 | Kachi et al. |
| 2006/0131992 A1* | 6/2006 | Nakao et al. ............... 310/313 B |
| 2007/0008052 A1* | 1/2007 | Wada et al. .................. 333/196 |
| 2008/0309192 A1 | 12/2008 | Nakao et al. |
| 2008/0315973 A1* | 12/2008 | Nakamura et al. ............ 333/196 |
| 2012/0044027 A1 | 2/2012 | Nakanishi et al. |
| 2012/0068787 A1 | 3/2012 | Takata |

\* cited by examiner

LADDER FILTER DEVICE AND ELASTIC WAVE RESONATOR

BACKGROUND OF THE INVENTION

1. Field of the Invention

The present invention relates to ladder filter devices and elastic wave resonators.

2. Description of the Related Art

In the prior art, ladder filter devices are used as, for example, band pass filters of RF circuits for cellular phones or the like. An example of such ladder filter devices is described, for example, in Japanese Unexamined Patent Application Publication No. 09-246911. In this exemplary ladder filter device, a parallel arm resonator is composed of an apodization-weighted surface acoustic wave resonator, and a series arm resonator is composed of a regular surface acoustic wave resonator. Japanese Unexamined Patent Application Publication No. 09-246911 describes that the ladder filter device with the foregoing configuration is capable of suppressing ripples in a pass band.

However, there is a problem that the ladder filter device described in Japanese Unexamined Patent Application Publication No. 09-246911 cannot adequately suppress an insertion loss at a low frequency side portion of pass band.

SUMMARY OF THE INVENTION

Preferred embodiments of the present invention provide a ladder filter device that has a smaller insertion loss in a low frequency side portion of passing band.

A ladder filter device according to a preferred embodiment of the present invention includes a first signal terminal, a second signal terminal, a series arm, a plurality of series arm resonators, a parallel arm, and a parallel arm resonator. The series arm connects the first signal terminal and the second signal terminal. The plurality of series arm resonators is connected in series in the series arm. The parallel arm connects the series arm and a ground potential. The parallel arm resonator is arranged in the parallel arm. The series arm resonator is defined by an elastic wave resonator including a piezoelectric substrate and an IDT electrode (i.e., an inter-digital transducer electrode) arranged on the piezoelectric substrate. The IDT electrode includes a first comb-shaped electrode and a second comb-shaped electrode, which are inserted into each other in a staggered arrangement. Each of the first comb-shaped electrode and the second comb-shaped electrode includes a busbar and a plurality of electrode fingers connected to the busbar. In each of the first comb-shaped electrode and the second comb-shaped electrode, an apodization angle falls in a range from about 2° to about 14°, for example, the apodization angle being an angle between an elastic wave propagation direction and an envelope line that connects tips of the plurality of electrode fingers.

In a certain preferred embodiment of the ladder filter device according to the present invention, the parallel arm resonator is defined by an elastic wave resonator including a piezoelectric substrate and an IDT electrode arranged on the piezoelectric substrate. The IDT electrode of the parallel arm resonator includes a third comb-shaped electrode and a fourth comb-shaped electrode, which are inserted into each other in a staggered arrangement. Each of the third comb-shaped electrode and the fourth comb-shaped electrode includes a busbar and a plurality of electrode fingers connected to the busbar. The apodization angle in the series arm resonator is less than the apodization angle in the parallel arm resonator. This configuration allows the impedance to increase at an anti-resonant frequency of the parallel arm resonator. Accordingly, the insertion loss of filter may be reduced.

An elastic wave resonator according to a preferred embodiment of the present invention is an elastic wave resonator including a piezoelectric substrate and an IDT electrode arranged on the piezoelectric substrate. The IDT electrode includes a first comb-shaped electrode and a second comb-shaped electrode, which are inserted into each other in a staggered arrangement. Each of the first comb-shaped electrode and the second comb-shaped electrode includes a busbar and a plurality of electrode fingers connected to the busbar. In each of the first comb-shaped electrode and the second comb-shaped electrode, an apodization angle falls in a range from about 2° to about 14°, for example, the apodization angle being an angle between an elastic wave propagation direction and an envelope line that connects tips of the plurality of electrode fingers.

In the ladder filter device according to preferred embodiments of the present invention, the apodization angle in the series arm resonator preferably falls in the range from about 2° to about 14°, for example. Accordingly, the insertion loss in a low frequency side portion of passing band is significantly reduced.

In the elastic wave resonator according to various preferred embodiments of the present invention, the apodization angle preferably falls in the range from about 2° to about 14°, for example. Thus, the return loss near a resonant frequency may be reduced. Accordingly, a ladder filter device that has a smaller insertion loss in a low frequency side portion of passing band may be achieved by using the elastic wave resonator according to preferred embodiments of the present invention as a series arm resonator.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the Drawings. A preferred embodiment of the present invention is described using a ladder filter device 1 illustrated in FIG. 1 as an example. It is noted that the ladder filter device 1 is for illustrative purposes only, and the preferred embodiments of the present invention are not limited to the ladder filter device 1.

Figure 1:
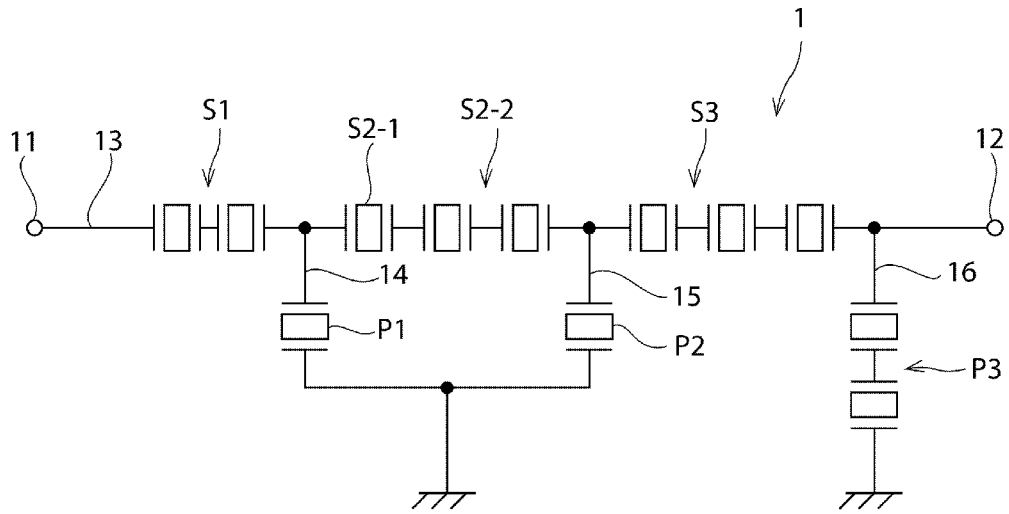
FIG. 1 is a schematic circuit diagram of a ladder filter device according to a preferred embodiment of the present invention.

FIG. 1 is a schematic circuit diagram of the ladder filter device according to the present preferred embodiment. As illustrated in FIG. 1, the ladder filter device 1 preferably includes a first signal terminal 11 and a second signal terminal 12. A series arm 13 connects the first terminal 11 and the second terminal 12. In the series arm 13, a plurality of series arm resonators S1, S2-1, S2-2, and S3 are preferably connected in series.

A plurality of parallel arms 14 to 16 preferably connects the series arm 13 and a ground potential. The parallel arms 14 to 16 are provided with parallel arm resonators P1 to P3, respectively.

Figure 2:
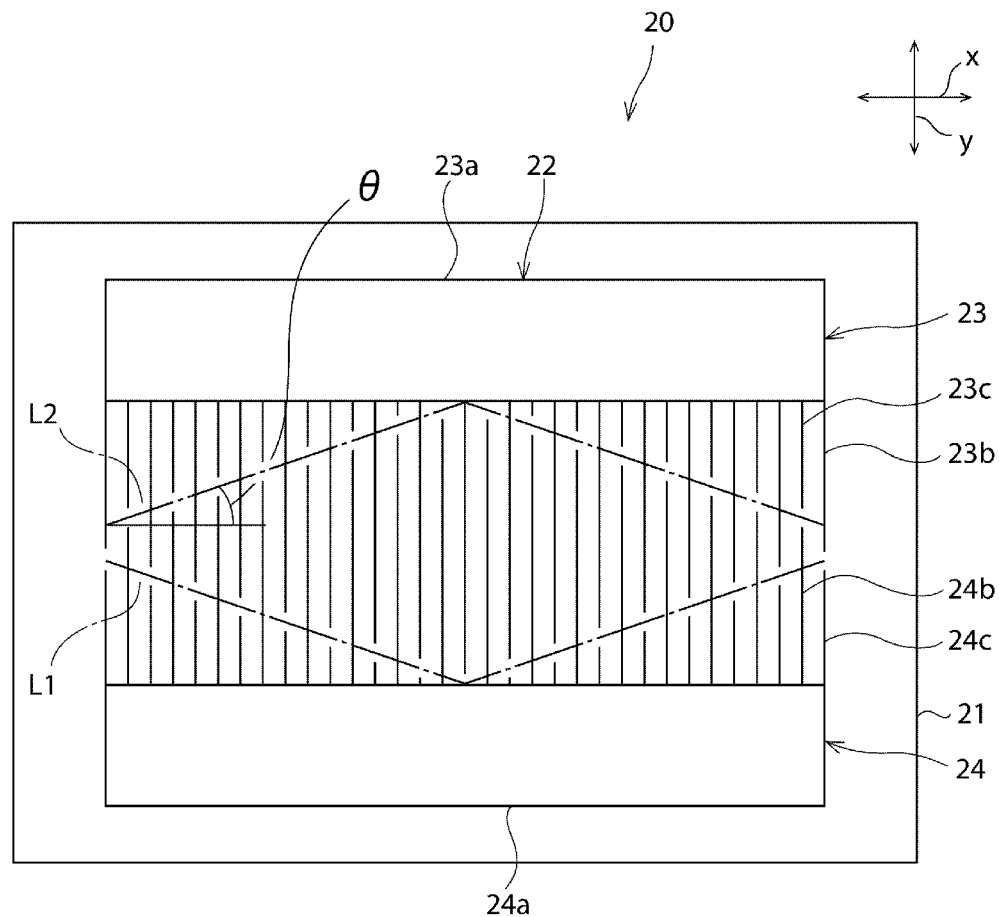
FIG. 2 is a schematic plan view of a surface acoustic wave resonator according to a preferred embodiment of the present invention.

The series arm resonators S1, S2-1, S2-2, S3 and the parallel arm resonators P1 to P3 are each preferably defined by one or more surface acoustic wave resonators. FIG. 2 is a schematic plan view of a surface acoustic wave resonator 20, of which the series arm resonators S1, S2-1, S2-2, S3 and the parallel arm resonators P1 to P3 are each preferably defined by.

As illustrated in FIG. 2, the surface acoustic wave resonator 20 of the present preferred embodiment is preferably an apodization-weighted surface acoustic wave resonator. More specifically, the surface acoustic wave resonator 20 includes a piezoelectric substrate 21 and an IDT electrode 22. The piezoelectric substrate 21 may be defined by, for example, a $LiNbO_3$ substrate, a $LiTaO_3$ substrate, a quartz crystal substrate, or the like.

The IDT electrode 22 is arranged on the piezoelectric substrate 21. The IDT electrode 22 may preferably be made of, for example, a metal selected from a group consisting of Al, Pt, Au, Ag, Cu, Ni, Ti, Cr, and Pd, an alloy including at least one type of metal selected from a group consisting of Al, Pt, Au, Ag, Cu, Ni, Ti, Cr, and Pd, or the like. Furthermore, the IDT electrode 22 may alternatively be defined by, for example, a multilayer body including a plurality of electrically conductive layers made of the metal or the alloy described above. Furthermore, on a surface of the piezoelectric substrate 21, a pair of reflectors may be provided on both sides of the IDT electrode 22 in a surface acoustic wave propagation direction x.

The IDT electrode 22 preferably includes a pair of comb-shaped electrodes 23, 24 that are inserted into each other in a staggered arrangement. The comb-shaped electrodes 23, 24 include busbars 23a, 24a, pluralities of electrode fingers 23b, 24b, and pluralities of dummy electrodes 23c, 24c, respectively. The pluralities of electrode fingers 23b, 24b are connected to the busbars 23a, 24a, respectively. The electrode fingers 23b, 24b extend from the busbars 23a, 24a along an intersecting width direction y that is perpendicular or substantially perpendicular to the surface acoustic wave propagation direction x. The electrode fingers 23b, 24b are arranged in an alternating fashion along the surface acoustic wave propagation direction x. The pluralities of dummy electrodes 23c, 24c are connected to the busbars 23a, 24a. The dummy electrodes 23c, 24c extend along the intersecting width direction y. Tips of the dummy electrodes 23c, 24c each face counterpart tips of the electrode fingers 24b, 23b in the intersecting width direction y.

In the present preferred embodiment, the IDT electrode 22 is configured with apodization weights. Specifically, apodization angle θ is larger than 0°. Here, the apodization angle θ is an angle between the surface acoustic wave propagation direction x and each of a first envelope line L1 that connects the tips of the plurality of electrode fingers 23b and a second envelope line L2 that connects the tips of the plurality of electrode fingers 24b. More specifically, in the series arm resonators S1, S2-1, S2-2, and S3, the apodization angles θ preferably fall in the range from about 2° to about 14°, for example. The apodization angles θ in the parallel arm resonators P1 to P3 are more than those of the series arm resonators S1, S2-1, S2-2, and S3. For example, the apodization angles θ in the parallel arm resonators P1 to P3 are about 28° or less while also being greater than the apodization angles θ in the series arm resonators S1, S2-1, S2-2, and S3. Furthermore, in the present invention, it may not be necessary to configure the IDT electrode of the parallel arm resonator with apodization weights. The IDT electrode of the parallel arm resonator may be, for example, a regular IDT electrode.

Figure 3:
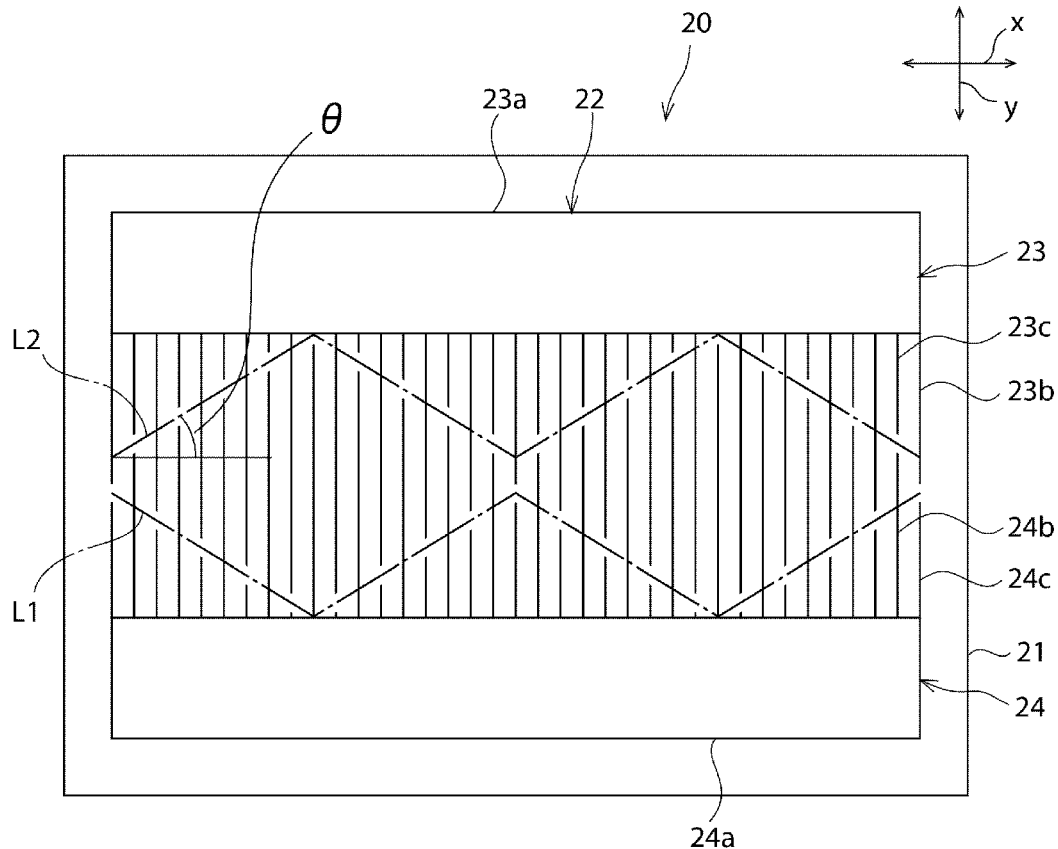
FIG. 3 is a schematic plan view of a modification example of a surface acoustic wave resonator according to a preferred embodiment of the present invention.

In the present preferred embodiment, the IDT electrode 22 is preferably provided such that one local maximum point at which the intersecting width of the electrode fingers 23b, 24b reaches a maximum value is provided. However, for example, as illustrated in FIG. 3, the IDT electrode may also be configured so as to have a plurality of local maximum points at which the intersecting width of the electrode fingers 23b, 24b reaches maximum values. Thus, as shown in FIGS. 2 and 3, the first envelope line L1 and the second envelope line L2 both preferably extend in a zigzagged or serpentine manner in the elastic wave propagation direction.

As described above, in the present preferred embodiment, the apodization angles θ in the series arm resonators S1, S2-1, S2-2, and S3 are preferably determined so as to preferably fall in the range from about 2° to about 14°, for example. Accordingly, the return losses of the series arm resonators S1, S2-1, S2-2, and S3 may be reduced. As a result, the insertion loss in a low frequency side portion of passing band may be reduced. This effect may be obtained when the apodization angle θ of at least one of these series arm resonators falls in the range from about 2° to about 14°, for example. Accordingly, in the present invention, it is not always necessary to have the apodization angles θ that fall in the range from about 2° to about 14° in all the series arm resonators, and only some of the series arm resonators may have the apodization angles θ that fall in the range from about 2° to about 14°, for example.

Hereinafter, this effect is described based on specific examples of preferred embodiments of the present invention.

Figure 4:
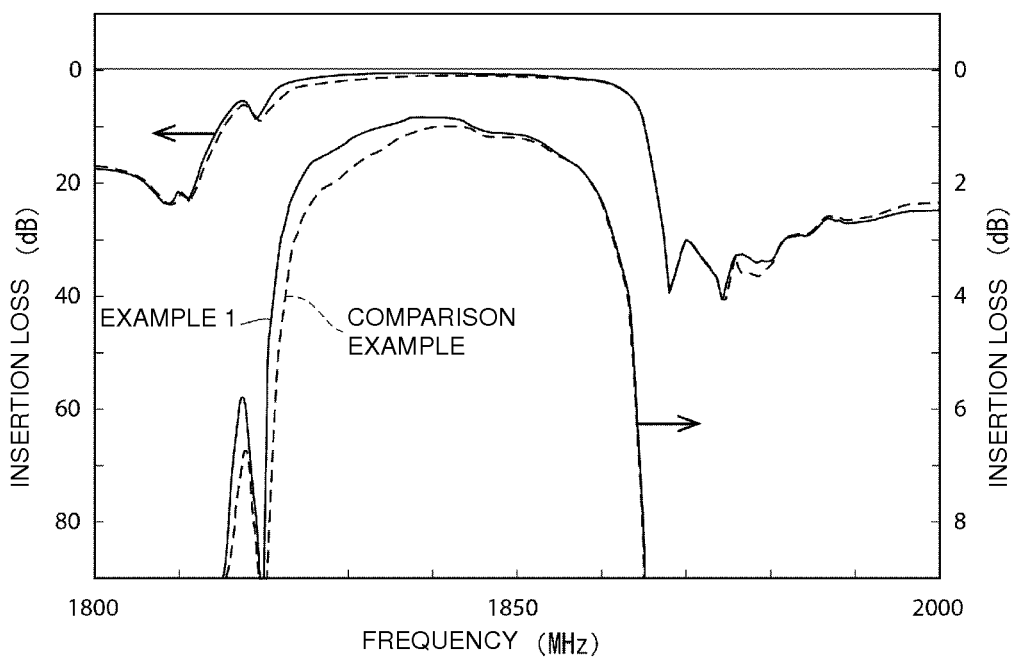
FIG. 4 is a graph illustrating an insertion loss of a ladder filter device according to an Example 1 and an insertion loss of a ladder filter device according to a comparison example.

First, as Example 1, a ladder filter device having a configuration substantially similar to that of the ladder filter device 1 according to the preferred embodiment described above is manufactured using the following design parameters, and the insertion loss thereof is measured. Results are illustrated in FIG. 4. Furthermore, as a comparison example, a ladder filter device different from the example in apodization angle as illustrated in the following Table 2 is manufactured, and the insertion loss thereof is measured. Results are illustrated in FIG. 4.

Design Parameters for Example 1

Piezoelectric substrate: $LiNbO_3$ substrate with a cut angle of 127.5°

Electrode configuration: from the piezoelectric substrate side, a NiCr film (10 nm thick), a Pt film (33.3 nm thick), a Ti film (10 nm thick), an AlCu film (130 nm thick), and a Ti film (10 nm thick)

A 623 nm thick $SiO_2$ film is arranged on the piezoelectric substrate, and a 20 nm thick SiN film is arranged on the $SiO_2$ film.

TABLE 1

| RESO-NATOR | NUMBER OF INTERSECTING WIDTH MAXIMA | APODIZATION RATIO (%) | NUMBER OF PAIRS | AVERAGE INTERSECTING WIDTH (μM) | ASPECT RATIO | APODIZATION ANGLE (°) | NUMBER OF ELECTRODE FINGERS IN REFLECTOR | WAVELENGTH (nm) |
|---|---|---|---|---|---|---|---|---|
| S3   | 1 | 90 | 168 | 30.29 | 0.10 | 8.86  | 20 | 1.8930 |
| P3   | 2 | 70 | 124 | 58.22 | 0.24 | 27.17 | 20 | 1.9705 |
| S2-2 | 1 | 90 | 230 | 37.34 | 0.08 | 7.91  | 20 | 1.9130 |
| S2-1 | 1 | 90 | 200 | 30.47 | 0.08 | 7.46  | 20 | 1.9046 |
| P2   | 2 | 70 | 120 | 49.47 | 0.21 | 24.33 | 20 | 1.9639 |
| S1   | 1 | 90 | 168 | 30.26 | 0.10 | 8.85  | 20 | 1.8937 |
| P1   | 2 | 70 | 104 | 42.77 | 0.21 | 24.19 | 20 | 1.9723 |

Design Parameters for Comparison Example

Piezoelectric substrate: LiNbO₃ substrate with a cut angle of 127.5°

Electrode configuration: from the piezoelectric substrate side, a NiCr film (10 nm thick), a Pt film (33.3 nm thick), a Ti film (10 nm thick), an AlCu film (130 nm thick), and a Ti film (10 nm thick)

A 623 nm thick $SiO_2$ film is arranged on the piezoelectric substrate, and a 20 nm thick SiN film is arranged on the $SiO_2$ film.

TABLE 2

| RESO-NATOR | NUMBER OF INTERSECTING WIDTH MAXIMA | APODIZATION RATIO (%) | NUMBER OF PAIRS | AVERAGE INTERSECTING WIDTH (μM) | ASPECT RATIO | APODIZATION ANGLE (°) | NUMBER OF ELECTRODE FINGERS IN REFLECTOR | WAVELENGTH (nm) |
|---|---|---|---|---|---|---|---|---|
| S3   | 2 | 90 | 168 | 30.29 | 0.10 | 17.31 | 20 | 1.8930 |
| P3   | 2 | 70 | 124 | 58.22 | 0.24 | 27.17 | 20 | 1.9705 |
| S2-2 | 2 | 90 | 230 | 37.34 | 0.08 | 15.52 | 20 | 1.9130 |
| S2-1 | 2 | 90 | 200 | 30.47 | 0.08 | 14.67 | 20 | 1.9046 |
| P2   | 2 | 70 | 120 | 49.47 | 0.21 | 24.33 | 20 | 1.9639 |
| S1   | 2 | 90 | 168 | 30.26 | 0.10 | 17.29 | 20 | 1.8937 |
| P1   | 2 | 70 | 104 | 42.77 | 0.21 | 24.19 | 20 | 1.9723 |

"ASPECT RATIO" is a ratio of a dimension in the intersecting width direction to a dimension in the elastic wave propagation direction of the IDT electrode.

As illustrated in FIG. 4, the comparison example, in which the apodization angles θ of the series arm resonators are larger than about 14°, has a larger insertion loss in a low frequency side portion of passing band. On the other hand, Example 1, in which the apodization angles θ of the series arm resonators are in the range from about 2° to about 14°, has a smaller insertion loss in the low frequency side portion of passing band.

Next, Example 2 is manufactured and the insertion loss thereof is measured. Example 2 is a ladder filter device having a configuration similar to that of the comparison example described above except that only the apodization angle θ of the series arm resonator S3 is reduced so as to fall in the range from about 2° to about 14°.

Figure 5:
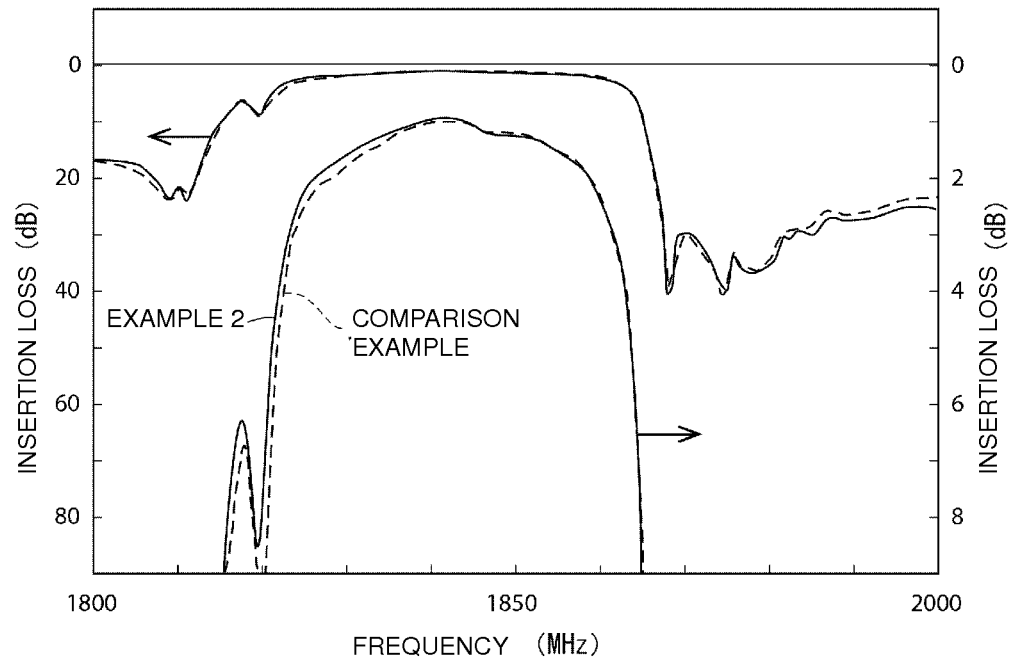
FIG. 5 is a graph illustrating an insertion loss of a ladder filter device according to an Example 2 and an insertion loss of a ladder filter device according to a comparison example.

Results are illustrated in FIG. 5.

It is clear from the results illustrated in FIG. 5 that even in the case where only the apodization angle θ of the series arm resonator S3 is reduced so as to fall in the range from about 2° to about 14°, the insertion loss in the low frequency side portion of passing band is significantly reduced.

From the foregoing results, it is clear that the insertion loss in the low frequency side portion of passing band is significantly reduced by setting the apodization angle θ of the series arm resonator in the range from about 2° to about 14°, for example.

Figure 6:
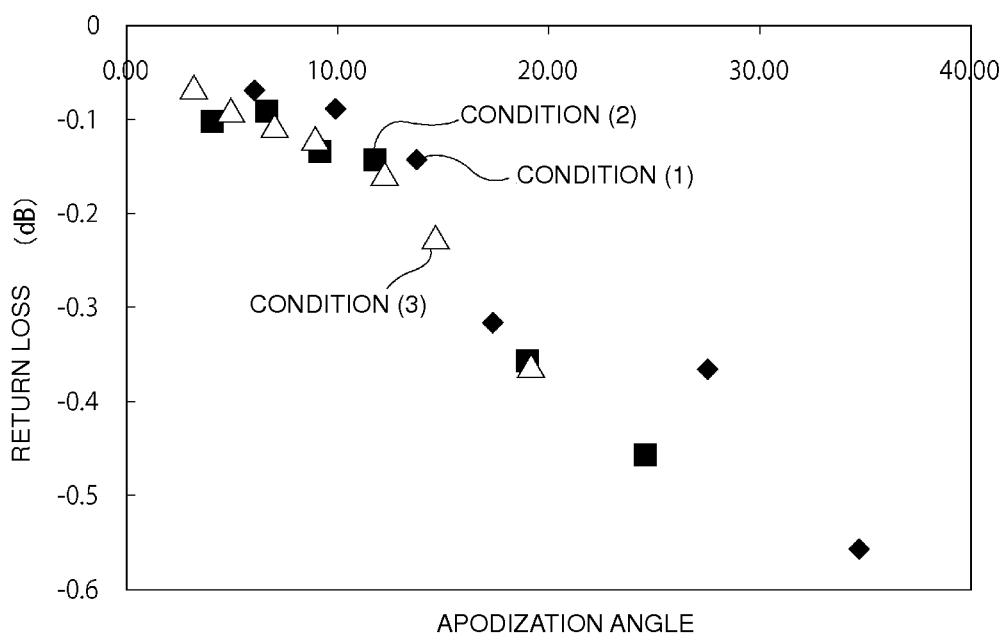
FIG. 6 is a graph illustrating relations between apodization angles and return losses of surface acoustic wave resonators.

Next, various surface acoustic wave resonators of the following conditions (1) to (3) are manufactured with different apodization angles θ, and the return losses thereof are measured. Results are illustrated in FIG. 6. It is clear from the results illustrated in FIG. 6 that the return loss is significantly reduced by setting the apodization angle θ to be equal to or less than about 14°, for example.

Condition (1):

Piezoelectric substrate: LiNbO₃ substrate with a cut angle of 127.5°

Electrode configuration: from the piezoelectric substrate side, a NiCr film (10 nm thick), a Pt film (33.3 nm thick), a Ti film (10 nm thick), an AlCu film (130 nm thick), and a Ti film (10 nm thick)

A 623 nm thick $SiO_2$ film is arranged on the piezoelectric substrate, and a 20 nm thick SiN film is arranged on the $SiO_2$ film.

Number of intersecting width maxima: 2
Apodization ratio: 0.9
Number of pairs: 168
Average intersecting width: 30.29 μm
Aspect ratio: 0.10
Number of electrode fingers in reflector: 20
Wavelength (λ): 1.8930 nm Condition (2):

Piezoelectric substrate: LiNbO₃ substrate with a cut angle of 127.5°

Electrode configuration: from the piezoelectric substrate side, a NiCr film (10 nm thick), a Pt film (33.3 nm thick), a Ti film (10 nm thick), an AlCu film (130 nm thick), and a Ti film (10 nm thick)

A 623 nm thick $SiO_2$ film is arranged on the piezoelectric substrate, and a 20 nm thick SiN film is arranged on the $SiO_2$ film.

Number of intersecting width maxima: 2
Apodization ratio: 0.7
Number of pairs: 168
Average intersecting width: 30.29 μm Aspect ratio: 0.10
Number of electrode fingers in reflector: 20
Wavelength ($\lambda$): 1.8930 nm
Condition (3):
Piezoelectric substrate: LiNbO$_3$ substrate with a cut angle of 127.5°
Electrode configuration: from the piezoelectric substrate side, a NiCr film (10 nm thick), a Pt film (33.3 nm thick), a Ti film (10 nm thick), an AlCu film (130 nm thick), and a Ti film (10 nm thick)
A 623 nm thick SiO$_2$ film is arranged on the piezoelectric substrate, and a 20 nm thick SiN film is arranged on the SiO$_2$ film.
Number of intersecting width maxima: 1
Apodization ratio: 0.9
Number of pairs: 168
Average intersecting width: 30.29 μm
Aspect ratio: 0.10
Number of electrode fingers in reflector: 20
Wavelength ($\lambda$): 1.8930 nm In the present preferred embodiment, as an example of the ladder filter device based on which various preferred embodiments of the present invention are implemented, the ladder filter device is described, in which surface acoustic wave resonators are preferably used as the parallel arm resonators or the series arm resonators, as an example. However, the ladder filter device according to the present invention is not limited thereto. In the ladder filter device according to other preferred embodiments of the present invention, a boundary acoustic wave resonator may also be used as the series arm resonator or the parallel arm resonator. Furthermore, the elastic wave resonator according to the present invention may be a surface acoustic wave resonator or a boundary acoustic wave resonator.

Figure 7:
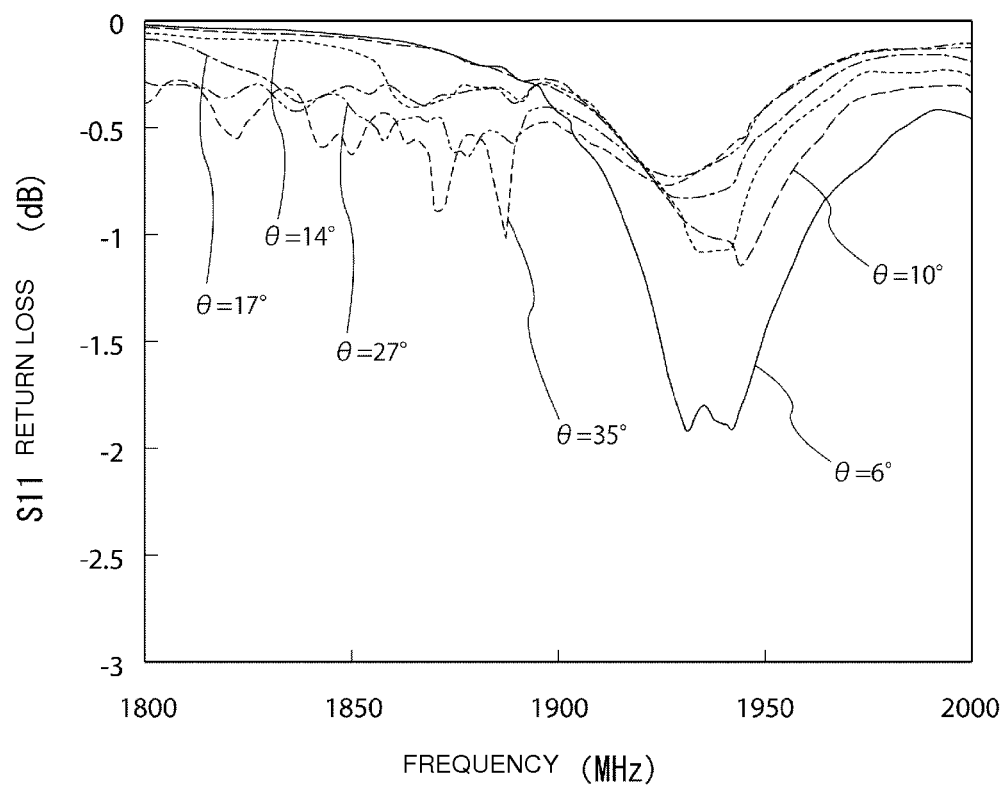
FIG. 7 is a diagram illustrating return losses of 1-port surface acoustic wave resonator with various apodization angles.

FIG. 7 is a diagram illustrating return losses of 1-port surface acoustic wave resonator with various apodization angles. In FIG. 7, a graph curve denoted by θ=6° represents a return loss when the apodization angle is 6°. A graph curve denoted by θ=10° represents a return loss when the apodization angle is 10°. A graph curve denoted by θ=14° represents a return loss when the apodization angle is 14°. A graph curve denoted by θ=17° represents a return loss when the apodization angle is 17°. A graph curve denoted by θ=27° represents a return loss when the apodization angle is 27°. A graph curve denoted by θ=35° represents a return loss when the apodization angle is 35°.

It is apparent from the results illustrated in FIG. 7 that the return losses periodically repeat their rise and fall in a frequency band from about 1800 MHz to about 1900 MHz, to which a passing band of the ladder filter device belongs and which is near a resonant frequency, when the apodization angle is too large. It is conceivable that this periodic rise and fall in return loss is one of factors that cause the insertion loss to increase in the low frequency side portion of passing band of the ladder filter device. Furthermore, it is clear that the periodic rise and fall in return loss in the frequency band from 1800 MHz to 1900 MHz may be reduced by setting the apodization angle in a predetermined range. According to the above, it is conceivable that the insertion loss in the low frequency side portion of passing band of the ladder filter device may be reduced by setting the apodization angle of the series arm resonator in a preferred range.

It should be noted that with the present invention, it was discovered for the first time that the return loss periodically repeats its rise and fall in the frequency band from about 1800 MHz to about 1900 MHz when the apodization angle is too large.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder filter device comprising:
a first signal terminal and a second signal terminal;
a series arm that connects the first signal terminal and the second signal terminal;
a plurality of series arm resonators connected in series in the series arm;
a parallel arm that connects the series arm and a ground potential; and
at least one parallel arm resonator arranged in the parallel arm; wherein
at least one of the series arm resonators includes an elastic wave resonator including a piezoelectric substrate and an IDT electrode arranged on the piezoelectric substrate;
the IDT electrode includes a first comb-shaped electrode and a second comb-shaped electrode, each of which includes a busbar and a plurality of electrode fingers connected to the busbar, the first comb-shaped electrode and the second comb-shaped electrode being inserted into each other in a staggered arrangement;
in each of the first comb-shaped electrode and the second comb-shaped electrode, an apodization angle falls in a range from about 2° to about 14°, the apodization angle being an angle between an elastic wave propagation direction and an envelope line that connects tips of the plurality of electrode fingers;
the at least one parallel arm resonator is defined by an elastic wave resonator including a piezoelectric substrate and an IDT electrode arranged on the piezoelectric substrate;
the IDT electrode of the at least one parallel arm resonator includes a third comb-shaped electrode and a fourth comb-shaped electrode, each of which includes a busbar and a plurality of electrode fingers connected to the busbar, the third comb-shaped electrode and the fourth comb-shaped electrode being inserted into each other in a staggered arrangement;
the apodization angle in the at least one of the series arm resonators is less than the apodization angle in the at least one parallel arm resonator; and
the apodization angle in the at least one parallel arm resonator is about 28° or less and is greater than the apodization angle in the at least one of the series arm resonators.

2. The ladder filter device according to claim 1, wherein each of the first comb-shaped electrode and the second comb-shaped electrode include respective pluralities of dummy electrodes.

3. The ladder filter device according to claim 2, wherein respective lengths of ones of the plurality of electrode fingers in at least one of the series arm and parallel arm elastic wave resonators increase from an outside of the IDT electrode to an inside of the IDT electrode in a direction parallel or substantially parallel to the elastic wave propagation direction.

4. The ladder filter device according to claim 3, wherein respective lengths of ones of the pluralities of dummy electrodes decrease from the outside of the IDT electrode to the inside of the IDT electrode in the direction parallel or substantially parallel to the elastic wave propagation direction.

5. The ladder filter device according to claim 1, wherein respective lengths of ones of the plurality of electrode fingers in at least one of the series arm and parallel arm elastic wave resonators increase from an outside of the IDT electrode to an inside of the IDT electrode in a direction parallel or substantially parallel to the elastic wave propagation direction.

6. The ladder filter device according to claim 1, wherein the IDT electrode in at least one of the series arm and parallel arm elastic wave resonators includes only one local maximum point at which a length of one of the plurality of electrode fingers reaches a maximum value which is longer than lengths of all remaining ones of the plurality of electrode fingers.

7. The ladder filter device according to claim 1, wherein the IDT electrode in at least one of the series arm and parallel arm elastic wave resonators includes more than one local maximum point at which lengths of ones of the plurality of electrode fingers reach a maximum value which is longer than lengths of all remaining ones of the plurality of electrode fingers.

8. The ladder filter device according to claim 1, wherein one of the plurality of series arm resonators includes fewer surface acoustic wave resonators than other ones of the plurality of series arm resonators.

9. The ladder filter device according to claim 1, wherein the at least one parallel arm resonator includes a plurality of parallel arm resonators with one of the plurality of parallel arm resonators including fewer surface acoustic wave resonators than other ones of the plurality of parallel arm resonators.

10. The ladder filter device according to claim 1, wherein the envelope line that connects tips of the plurality of electrode fingers in at least one of the series arm and parallel arm elastic wave resonators extends in a zigzagged or serpentine manner in the elastic wave propagation direction.

* * * * *